(12) United States Patent
Hopper et al.

(10) Patent No.: US 7,005,387 B2
(45) Date of Patent: Feb. 28, 2006

(54) METHOD FOR PREVENTING AN INCREASE IN CONTACT HOLE WIDTH DURING CONTACT FORMATION

(75) Inventors: Dawn Hopper, San Jose, CA (US); Hiroyuki Kinoshita, Sunnyvale, CA (US); Christy Woo, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 165 days.

(21) Appl. No.: 10/705,631

(22) Filed: Nov. 8, 2003

(65) Prior Publication Data

US 2005/0101148 A1    May 12, 2005

(51) Int. Cl.
*H01L 21/302* (2006.01)
*H01L 21/461* (2006.01)

(52) U.S. Cl. .............. 438/714; 438/715; 438/716; 438/720; 438/721; 438/722

(58) Field of Classification Search ........ 438/714–716, 438/720–722; 134/1.1–1.3
See application file for complete search history.

(56) References Cited

U.S. PATENT DOCUMENTS

| | | | |
|---|---|---|---|
| 6,010,958 A | * | 1/2000 | Chen et al. .......... 438/626 |
| 6,204,550 B1 | | 3/2001 | Wang et al. |
| 6,303,505 B1 | * | 10/2001 | Ngo et al. .......... 438/687 |
| 6,452,273 B1 | * | 9/2002 | Kim et al. .......... 257/754 |
| 6,498,091 B1 | | 12/2002 | Chen et al. |
| 6,511,575 B1 | | 1/2003 | Shindo et al. |
| 6,806,187 B1 | * | 10/2004 | Graettinger et al. ........ 438/675 |
| 2001/0012695 A1 | * | 8/2001 | Jin et al. .......... 438/700 |
| 2002/0045355 A1 | * | 4/2002 | Chong et al. .......... 438/721 |
| 2003/0073304 A1 | | 4/2003 | Mak et al. |

FOREIGN PATENT DOCUMENTS

| | | |
|---|---|---|
| EP | 1233448 | 8/2002 |
| JP | 06061181 | 3/1994 |

OTHER PUBLICATIONS

Wolf et al., Silicon Processing for the VLSI Era, 1986, vol. 1, p. 171, 198.*

* cited by examiner

*Primary Examiner*—Duy-Vu N. Deo
(74) *Attorney, Agent, or Firm*—Farjami & Farjami LLP

(57) ABSTRACT

According to one exemplary embodiment, a method for forming a contact over a silicide layer situated in a semiconductor die comprises a step of depositing a barrier layer on sidewalls of a contact hole and on a native oxide layer situated at a bottom of the contact hole, where the sidewalls are defined by the contact hole in a dielectric layer. The step of depositing the barrier layer on the sidewalls of the contact hole and on the native oxide layer can be optimized such that the barrier layer has a greater thickness at a top of the contact hole than a thickness at the bottom of the contact hole. According to this exemplary embodiment, the method further comprises a step of removing a portion of the barrier layer and the native oxide layer situated at the bottom of the contact hole to expose the silicide layer.

8 Claims, 9 Drawing Sheets

METHOD FOR PREVENTING AN INCREASE IN CONTACT HOLE WIDTH DURING CONTACT FORMATION

TECHNICAL FIELD

The present invention is generally in the field of semiconductor device fabrication. More particularly, the present invention is in the field of contact formation for semiconductor devices in a semiconductor die.

BACKGROUND ART

Contacts are utilized, among other things, to provide connections between a transistor region of a semiconductor die and an interconnect metal layer situated above the transistor region. To achieve high circuit density, these contacts, which generally have a high aspect ratio, must fit within a small area of the semiconductor die without touching or otherwise interfering with each other. As such, it is important to control contact hole width during contact formation to achieve a contact having a sufficiently small width.

During a conventional contact fabrication process, a contact hole is typically defined by lithography and etched in an oxide layer, which can be situated, for example, over a transistor region of a semiconductor die. The resulting contact hole can be formed over a silicide layer, which can be connected to, for example, a source or drain area in the transistor region of the semiconductor die. The contact hole is then lined with a barrier layer comprising a metal, such as titanium, and filled with a metal, such as tungsten, to form a contact. However, before the barrier layer can be deposited on the sidewalls of the contact hole and on the silicide layer situated at the bottom of contact hole, a native oxide layer that forms over the silicide layer must first be removed. In the conventional contact fabrication process, the native oxide layer is typically removed by utilizing a sputter etch process comprising argon.

However, during the sputter etch process, top corner portions of the oxide layer than defines the contact hole are also etched in addition to the native oxide layer, which causes the top of the contact hole to increase in width. As a result, the contact that is formed after the contact hole has been filled with tungsten has an undesirable increased width compared to the initial width of the patterned contact hole.

Thus, there is a need in the art for a method for forming a contact over a transistor region of a semiconductor die that prevents an undesirable increase in contact hole width during contact formation.

SUMMARY

The present invention is directed to method for preventing an increase in contact hole width during contact formation. The present invention addresses and resolves the need in the art for a method for forming a contact over a transistor region of a semiconductor die that prevents an undesirable increase in contact hole width during contact formation.

According to one exemplary embodiment, a method for forming a contact over a silicide layer situated in a semiconductor die comprises a step of depositing a barrier layer on sidewalls of a contact hole and on a native oxide layer situated at a bottom of the contact hole, where the sidewalls are defined by the contact hole in a dielectric layer. For example, the barrier layer may be titanium/titanium nitride and dielectric layer may be PECVD oxide. The step of depositing the barrier layer on the sidewalls of the contact hole and on the native oxide layer can be optimized such that the barrier layer has a greater thickness at a top of the contact hole than a thickness at the bottom of the contact hole.

According to this exemplary embodiment, the method further comprises a step of removing a portion of the barrier layer and the native oxide layer situated at the bottom of the contact hole to expose the silicide layer. For example, the portion of the barrier layer and the native oxide layer situated at the bottom of the contact hole can be removed by utilizing a sputter etch process. The contact hole comprises an electrical contact width, where the electrical contact width is not increased by the sputter etch process. The dielectric layer comprises top corner regions situated adjacent to the contact hole, where the top corner regions of the dielectric layer are not etch during the step of removing the portion of the barrier layer and the native oxide layer situated at the bottom of the contact hole. Other features and advantages of the present invention will become more readily apparent to those of ordinary skill in the art after reviewing the following detailed description and accompanying drawings.

DETAILED DESCRIPTION OF THE INVENTION

The present invention is directed to method for preventing increased contact hole width during contact formation in a semiconductor die. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
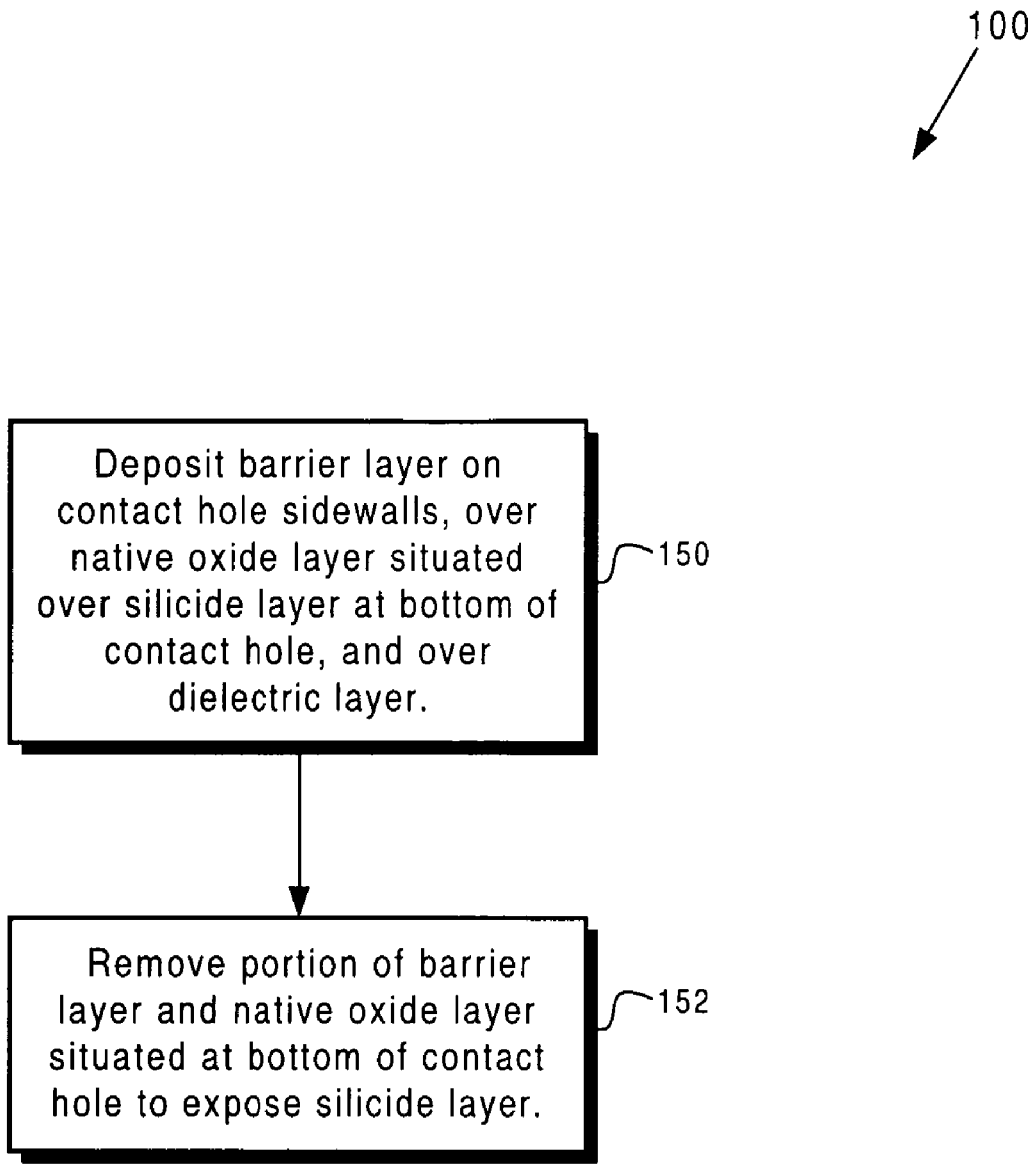
FIG. 1 is a flowchart corresponding to exemplary method steps according to one embodiment of the present invention.

FIG. 1 shows a flowchart illustrating an exemplary method for forming a contact over a transistor region in a semiconductor die according to one embodiment of the present invention. Certain details and features have been left out of flowchart 100 that are apparent to a person of ordinary skill in the art. For example, a step may consist of one or more substeps or may involve specialized equipment or materials, as known in the art. Steps 150 and 152 indicated in flowchart 100 are sufficient to describe one embodiment of the present invention, other embodiments of the invention may utilize steps different from those shown in flowchart 100. It is noted that the processing steps shown in flowchart 100 are performed on a wafer, which, prior to step 150, includes a contact hole formed in a dielectric layer and a native oxide layer situated over a silicide layer at the bottom of the contact hole, where the dielectric layer and silicide layer can be situated over a transistor region of a substrate (not shown in any of the figures). Structures 250 and 252 in FIGS. 2A and 2B illustrate the result of performing, on a structure including a contact hole formed in a dielectric layer situated over a transistor region of a substrate (not shown in any of the figures) discussed above, steps 150 and 152 of flowchart 100, respectively.

Figure 2A:
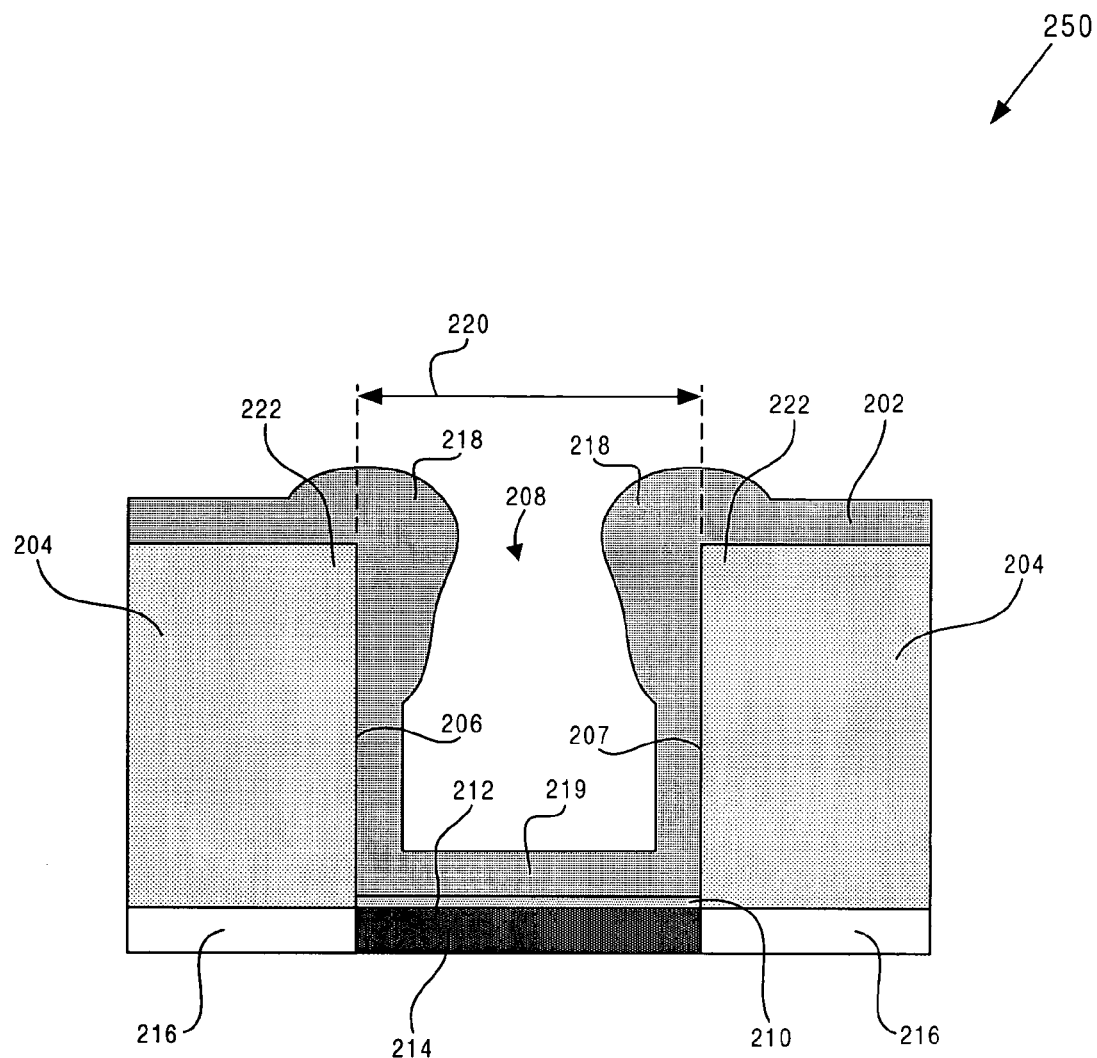
FIG. 2A illustrates a cross-sectional view of a portion of a wafer processed according to an embodiment of the invention, corresponding to certain steps of the flowchart in FIG. 1.

Referring now to step 150 in FIG. 1 and structure 250 in FIG. 2A, at step 150 of flowchart 100, barrier layer 202 is deposited over dielectric layer 204, on sidewalls 206 and 207 of contact hole 208, and over native oxide layer 210 situated at bottom 212 of contact hole 208 and also situated over silicide layer 214. As shown in FIG. 2A, dielectric layer 204 is situated over dielectric layer 216, which is situated over a transistor region of a substrate (not shown in FIG. 2A). Dielectric layer 204 can comprise silicon dioxide, which can be deposited, for example, in a plasma enhanced chemical vapor deposition ("PECVD") process. Silicon dioxide deposited in a PECVD process is also referred to as "PECVD oxide" in the present application. Native oxide layer 210 is situated over silicide layer 214 at bottom 212 of contact hole 208 and can comprise thermally grown oxide. By way of example, native oxide layer 210 can have a thickness of between 10.0 Angstroms and 50.0 Angstroms. Barrier layer 202 can be deposited on sidewalls 206 and 207 of contact hole 208, over native oxide layer 210, and over dielectric layer 204 in a manner known in the art and can comprise titanium/titanium nitride ("Ti/TiN"). In other embodiments, barrier layer 202 may comprise a different combination of metals or an appropriate single metal. In the present embodiment, the deposition of barrier layer 202 can be optimized such that portions 218 of barrier layer 202 situated adjacent to top corner regions 222 at the top of contact hole 208 have a greater thickness than portion 219 of barrier layer 202 situated at bottom 212 of contact hole 208. As a result, portions 218 of barrier layer 202 provide sufficient protection for top corner regions 222 of dielectric layer 604 during a subsequent sputter etch process. Contact hole width 220, which is the distance between sidewall 206 and 207 of contact hole 208, is also referred to as "electrical contact width" in the present application. Referring to FIG. 2A, the result of step 150 of flowchart 100 is illustrated by structure 250.

Figure 2B:
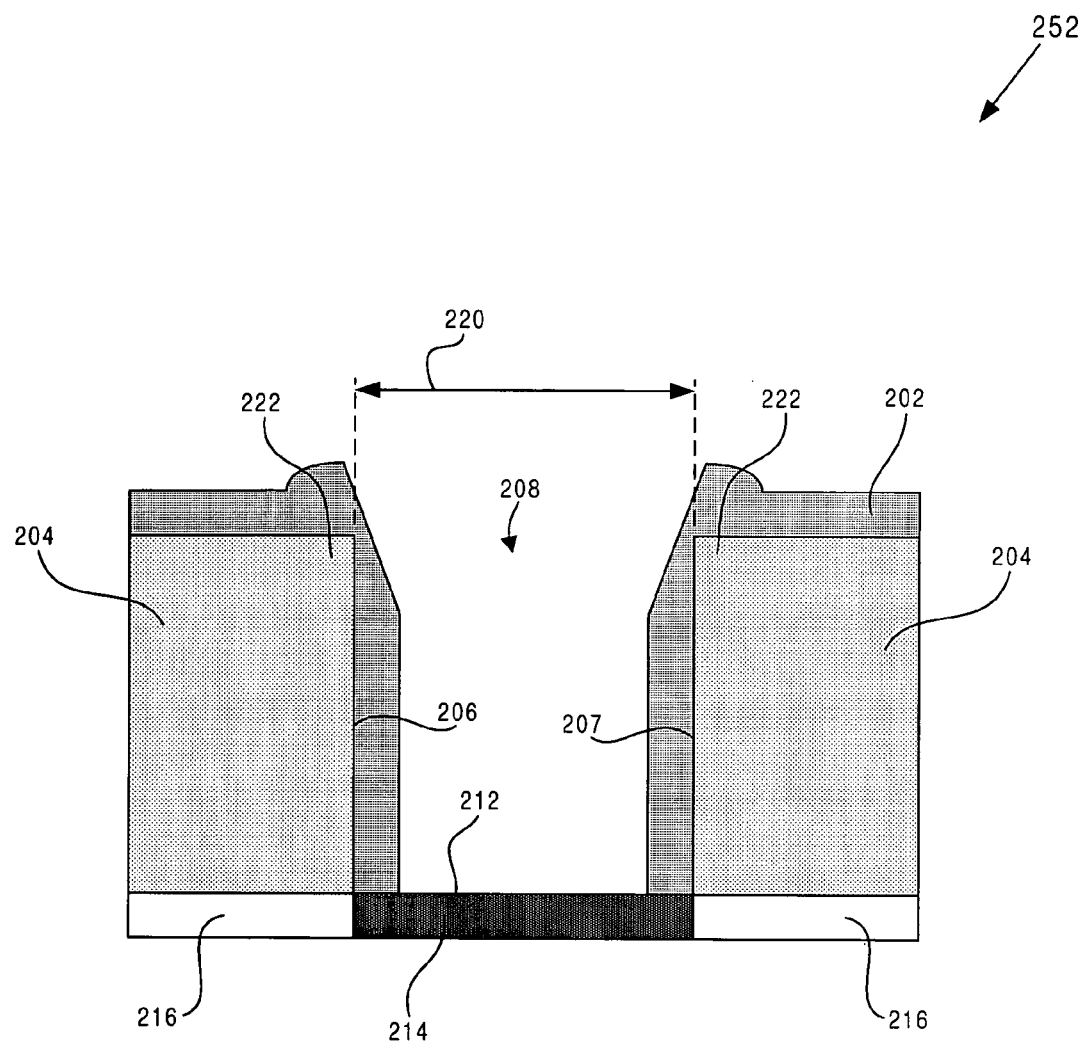
FIG. 2B illustrates a cross-sectional view of a portion of a wafer processed according to an embodiment of the invention, corresponding to certain steps of the flowchart in FIG. 1.

Continuing with step 152 in FIG. 1 and structure 252 in FIG. 2B, at step 152 of flowchart 100, portion 219 of barrier layer 202 and native oxide layer 210 situated at bottom 212 of contact hole 208 are removed to expose silicide layer 214. Portion 219 of barrier layer 202 situated at bottom 212 of contact hole 208 and native oxide layer 210 can be removed by utilizing a sputter etch process, which can comprise argon ("Ar"). The sputter etch process also removes portions of barrier layer 202 situated at the top of sidewalls 206 and 207. However, since portions 218 of barrier layer 202 (shown in FIG. 2A) have sufficient thickness to protect top corner regions 222 of dielectric layer 204, top corner regions 222 are not etched during the sputter etch process. As a result, contact hole width 220 is not increased during the sputter etch process. Contact hole 208 can be filled with a metal such as tungsten in a subsequent step to complete contact formation. Referring to FIG. 2B, the result of step 152 of flowchart 100 is illustrated by structure 252.

Thus, in the embodiment of the present invention in FIG. 1, by forming barrier layer 202 prior to performing a sputter etch process to remove native oxide layer 210 and optimizing the formation of barrier layer 202, the present invention avoids etching top corner regions 222 of dielectric layer 204. As a result, the present invention advantageously achieves a contact having a contact hole width that is not increased during the contact formation process.

Figure 3:
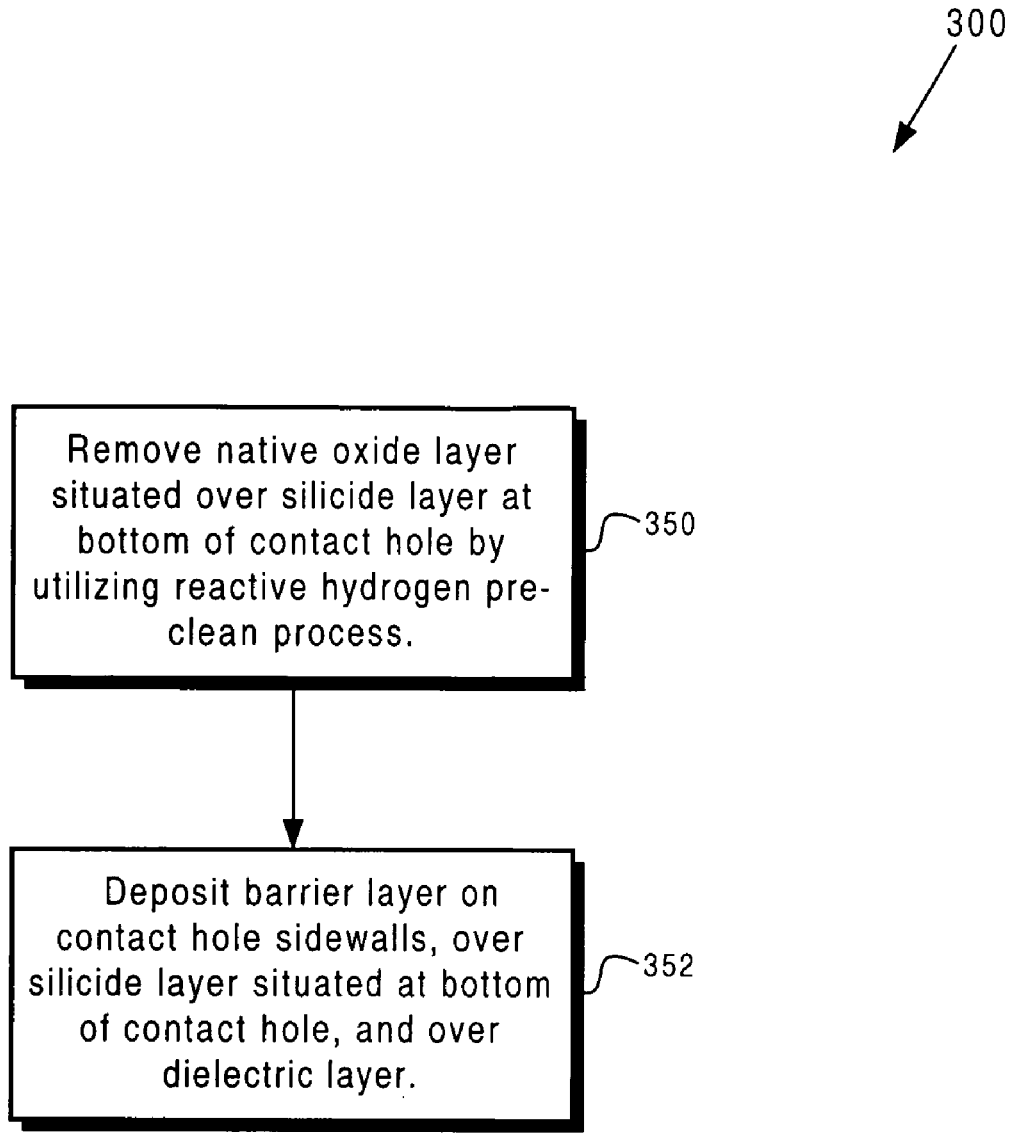
FIG. 3 is a flowchart corresponding to exemplary method steps according to one embodiment of the present invention.

FIG. 3 shows a flowchart illustrating an exemplary method for forming a contact over a transistor region of a wafer according to one embodiment of the present invention. Certain details and features have been left out of flowchart 300 that are apparent to a person of ordinary skill in the art. For example, a step may consist of one or more substeps or may involve specialized equipment or materials, as known in the art. Steps 350 and 352 indicated in flowchart 300 are sufficient to describe one embodiment of the present invention, other embodiments of the invention may utilize steps different from those shown in flowchart 300. It is noted that the processing steps shown in flowchart 300 are performed on a wafer, which, prior to step 350, includes a contact hole formed in a dielectric layer and a native oxide layer situated over a silicide layer at the bottom of the contact hole, where the dielectric layer and silicide layer can be situated over a transistor region of a substrate (not shown in any of the figures). Structures 350 and 352 in FIGS. 4A and 4B illustrate the result of performing, on a structure including a contact hole formed in a dielectric layer situated over a transistor region of a substrate (not shown in any of the figures) discussed above, steps 350 and 352 of flowchart 300, respectively.

Figure 4A:
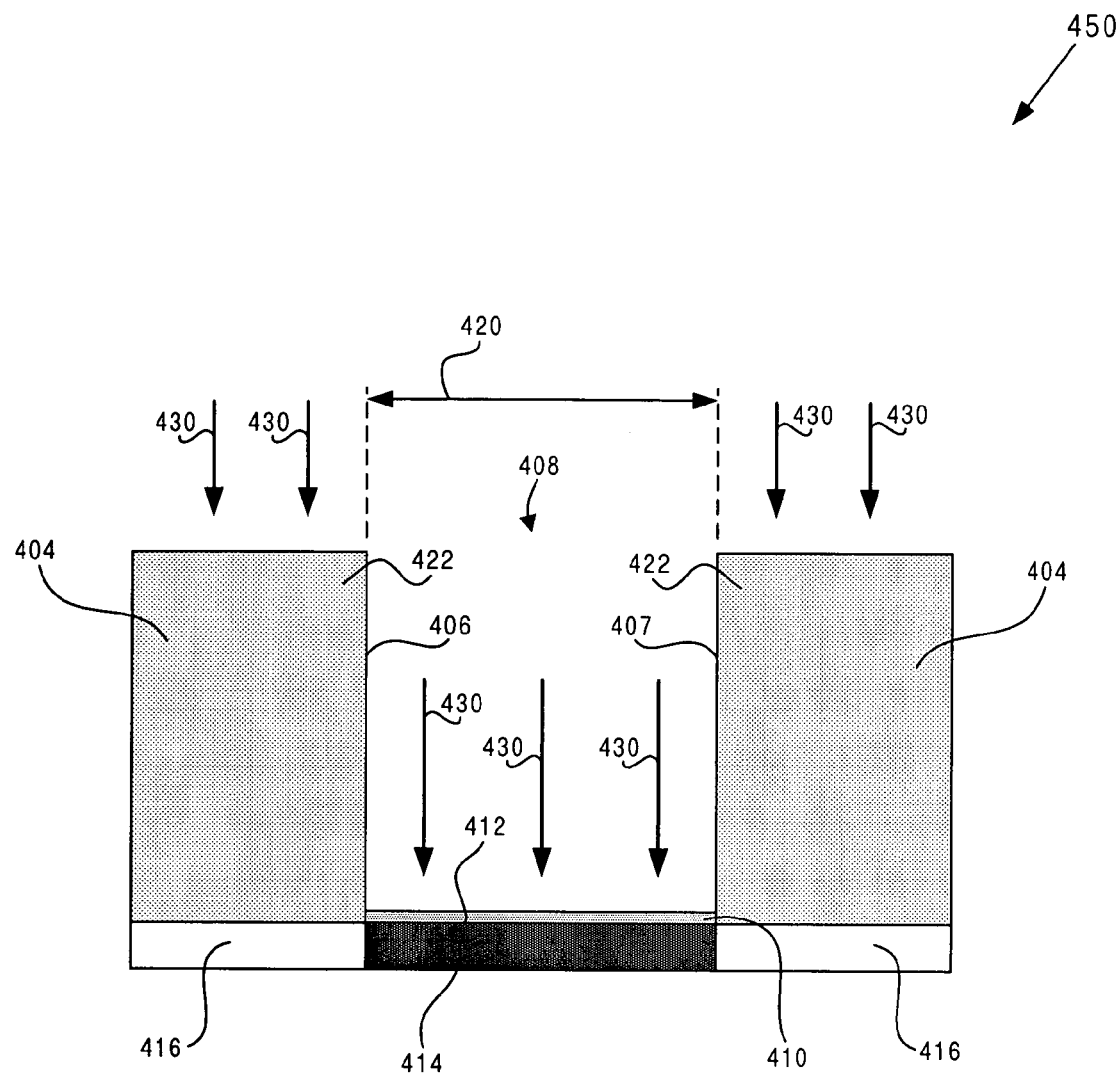
FIG. 4A illustrates a cross-sectional view of a portion of a wafer processed according to an embodiment of the invention, corresponding to certain steps of the flowchart in FIG. 3.

Referring now to step 350 in FIG. 3 and structure 450 in FIG. 4A, at step 350 of flowchart 300, native oxide layer 410 situated over silicide layer 414 is removed at bottom 412 of contact hole 408 by utilizing reactive hydrogen pre-clean 430. It is noted that although native oxide layer 410 is removed at step 350, native oxide layer 410 is shown in FIG. 4A to better illustrate the present embodiment of the invention. In FIG. 4A, dielectric layers 404 and 416, sidewalls 406 and 407, contact hole 408, native oxide layer 410, and silicide layer 414 in structure 450 correspond, respectively, to dielectric layers 204 and 216, sidewalls 206 and 207, contact hole 208, native oxide layer 210, and silicide layer 214 in structure 250 in FIG. 2A. In the present embodiment, dielectric layer 404 comprises PECVD oxide, which can be hardened in an annealing process after it (i.e. PECVD oxide)

has been deposited. Thus, dielectric layer 404 is much harder than native oxide layer 410, which comprises silicon oxide that is thermally grown at room temperature. As a result, when native oxide layer 410 is etched away (i.e. removed) by the reactive hydrogen pre-clean, i.e. reactive hydrogen pre-clean 430, top corner regions 422 of dielectric layer 404, which are situated at the tops of sidewalls 406, are not etched. Thus, contact hole width 420, which is the distance between sidewalls 406 and 407 of contact hole 408, is not increased after performance of reactive hydrogen pre-clean 430. Contact hole width 420 is similar to contact hole width 220 in FIG. 2A and is also referred to as "electrical contact width" in the present application. Referring to FIG. 4A, the result of step 350 of flowchart 300 is illustrated by structure 450.

Figure 4B:
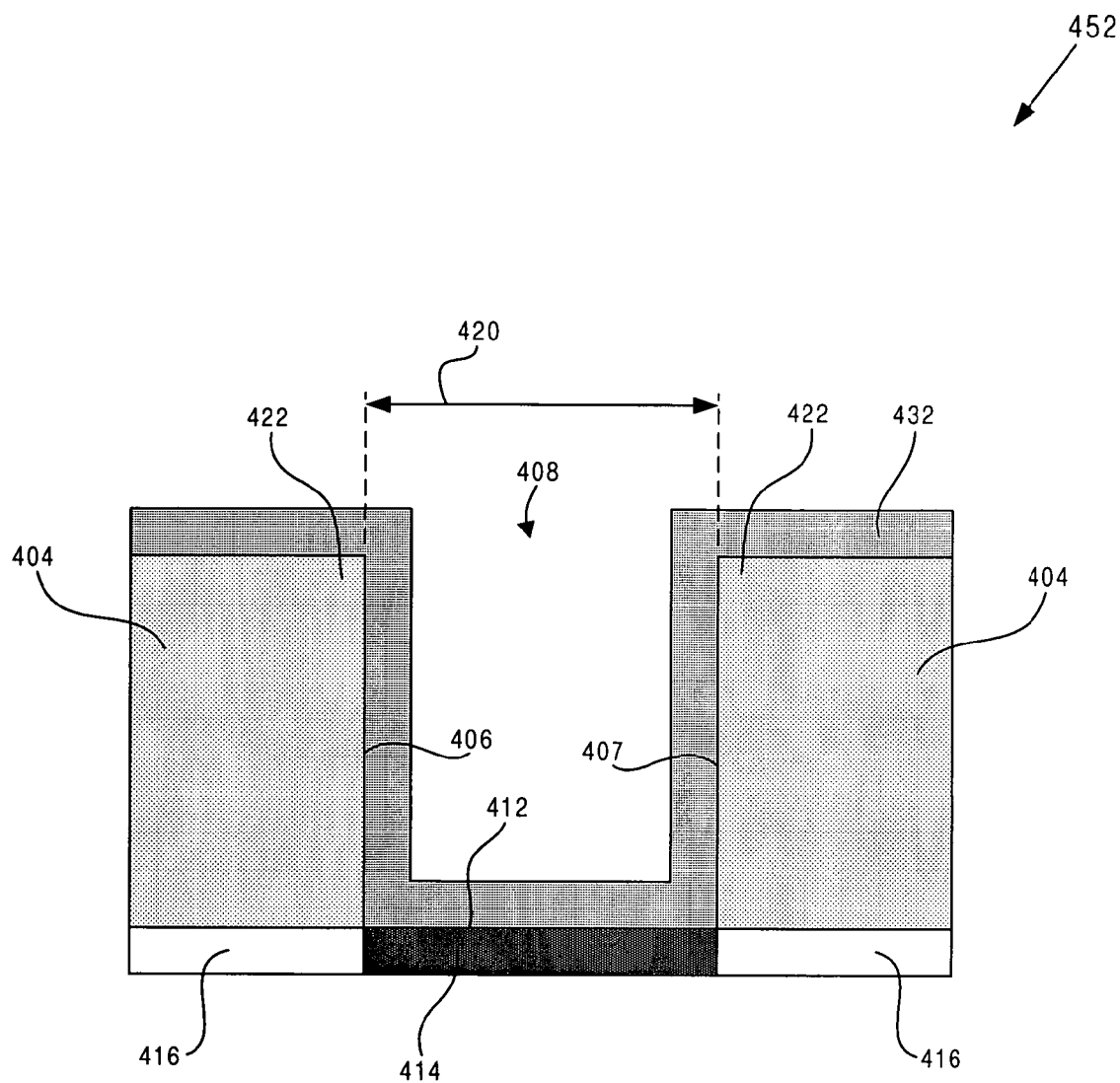
FIG. 4B illustrates a cross-sectional view of a portion of a wafer processed according to an embodiment of the invention, corresponding to certain steps of the flowchart in FIG. 3.

Continuing with step 352 in FIG. 3 and structure 452 in FIG. 4B, at step 352 of flowchart 300, barrier layer 432 is deposited on sidewalls 406 and 407 of contact hole 408, over silicide layer 414 situated at bottom 412 of contact hole 408, and over dielectric layer 404. Barrier layer 432 can be deposited in a manner known in the art and can comprise Ti/TiN. In other embodiments, barrier layer 432 may comprise a different combination of metals or an appropriate single metal. Contact hole 408 can be filled with a metal such as tungsten in a subsequent step to complete contact formation. Referring to FIG. 4B, the result of step 352 of flowchart 300 is illustrated by structure 452.

Thus, in the embodiment of the present invention in FIG. 3, by utilizing a reactive hydrogen pre-clean process to remove a native oxide layer at the bottom of a contact hole prior to depositing a barrier layer in the contact hole, the present invention advantageously provides a contact having a contact hole width that does not increase during contact formation.

Figure 5:
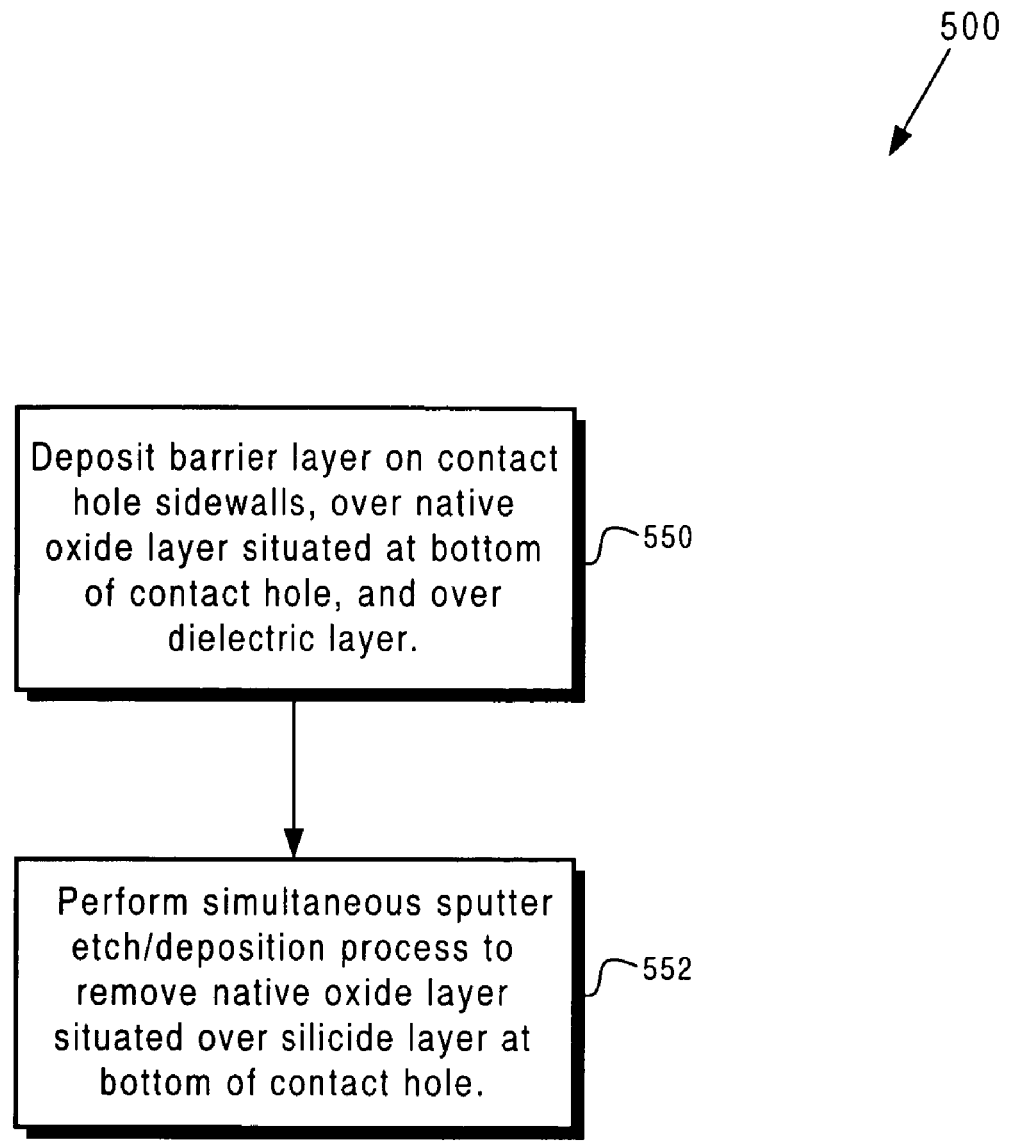
FIG. 5 is a flowchart corresponding to exemplary method steps according to one embodiment of the present invention.
Figure 6A:
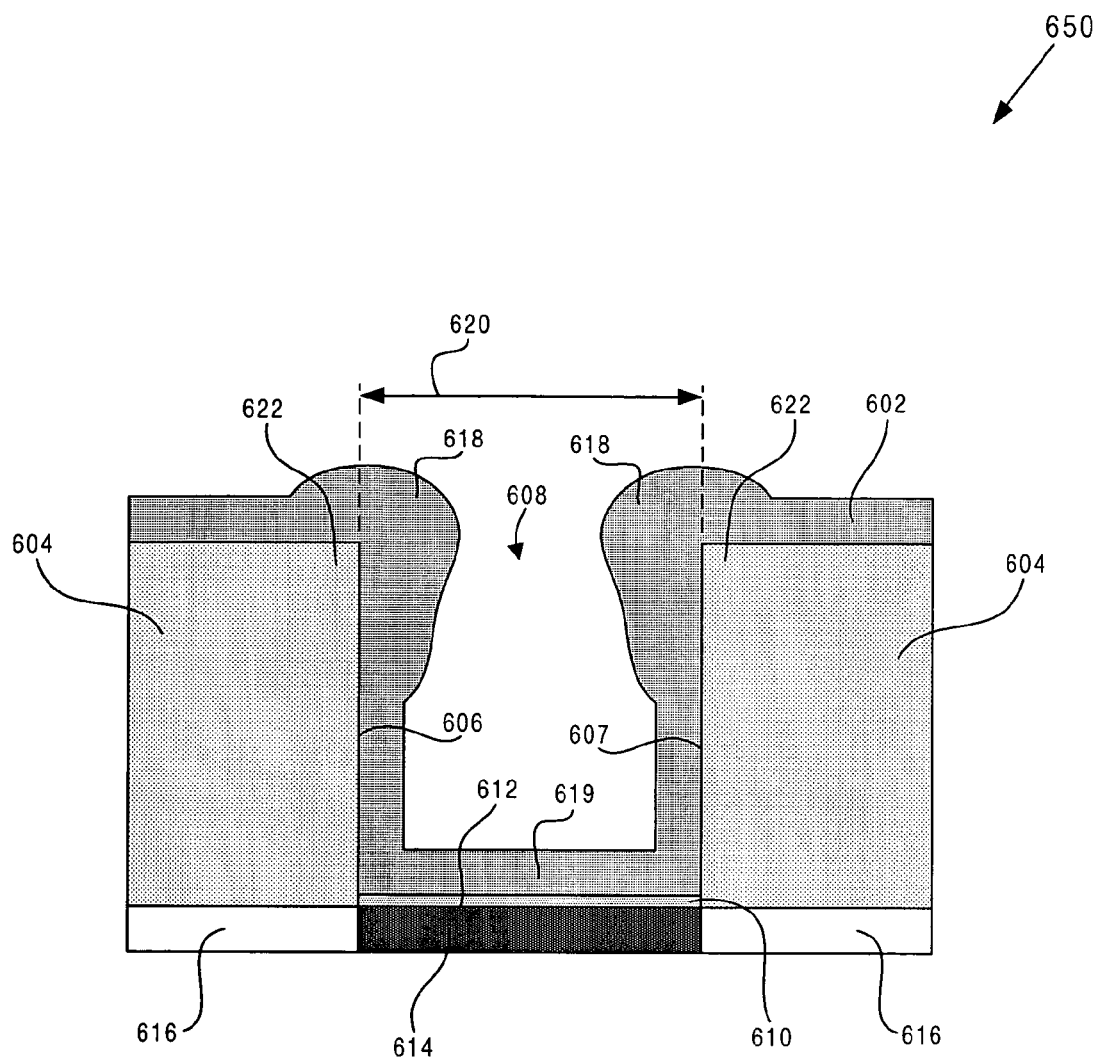
FIG. 6A illustrates a cross-sectional view of a portion of a wafer processed according to an embodiment of the invention, corresponding to certain steps of the flowchart in FIG. 5.

FIG. 5 shows a flowchart illustrating an exemplary method for forming a contact over a transistor region of a wafer according to an embodiment of the present invention. Certain details and features have been left out of flowchart 500 that are apparent to a person of ordinary skill in the art. For example, a step may consist of one or more substeps or may involve specialized equipment or materials, as known in the art. Steps 550 and 552 indicated in flowchart 500 are sufficient to describe one embodiment of the present invention, other embodiments of the invention may utilize steps different from those shown in flowchart 500. It is noted that the processing steps shown in flowchart 500 are performed on a wafer, which, prior to step 550, includes a contact hole formed in a dielectric layer and a native oxide layer situated over a silicide layer at the bottom of the contact hole, where the dielectric layer and silicide layer can be situated over a transistor region of a substrate (not shown in any of the figures). Structures 550 and 552 in FIGS. 6A and 6B illustrate the result of performing, on a structure including a contact hole formed in a dielectric layer situated over a transistor region of a substrate (not shown in any of the figures) discussed above, steps 550 and 552 of flowchart 500, respectively.

Referring now to step 550 in FIG. 5 and structure 450 in FIG. 4A, at step 550 of flowchart 500, barrier layer 602 is deposited on sidewalls 606 and 607 of contact hole 608, over native oxide layer 610 situated at bottom 612 of contact hole 608, and over dielectric layer 604, which is situated over dielectric layer 616. Step 550 in FIG. 5 corresponds to step 350 in FIG. 3. In particular, barrier layer 602, dielectric layers 604 and 616, sidewalls 606 and 607, contact hole 608, native oxide layer 610, bottom 612, silicide layer 614, portions 618, portion 619, contact hole width 620, and top corner regions 622 in structure 650 in FIG. 6A correspond, respectively, to barrier layer 202, dielectric layers 204 and 216, sidewalls 206 and 207, contact hole 208, native oxide layer 210, bottom 212, silicide layer 214, portions 218, portion 219, contact hole width 220, and top corner regions 222 in structure 250 in FIG. 2A. Thus, similar to contact hole width 220 in FIG. 2A, contact hole width 420 is also referred to as "electrical contact width" in the present application. Similar to barrier layer 202 in FIG. 2A, the deposition of barrier layer 602 can be optimized in the present embodiment such that portions 618 of barrier layer 602 situated adjacent to top corner portions 222 at the top of contact hole 608 have a greater thickness than portion 619 of barrier layer 602 situated at bottom 612 of contact hole 608. Referring to FIG. 6A, the result of step 550 of flowchart 500 is illustrated by structure 650.

Figure 6B:
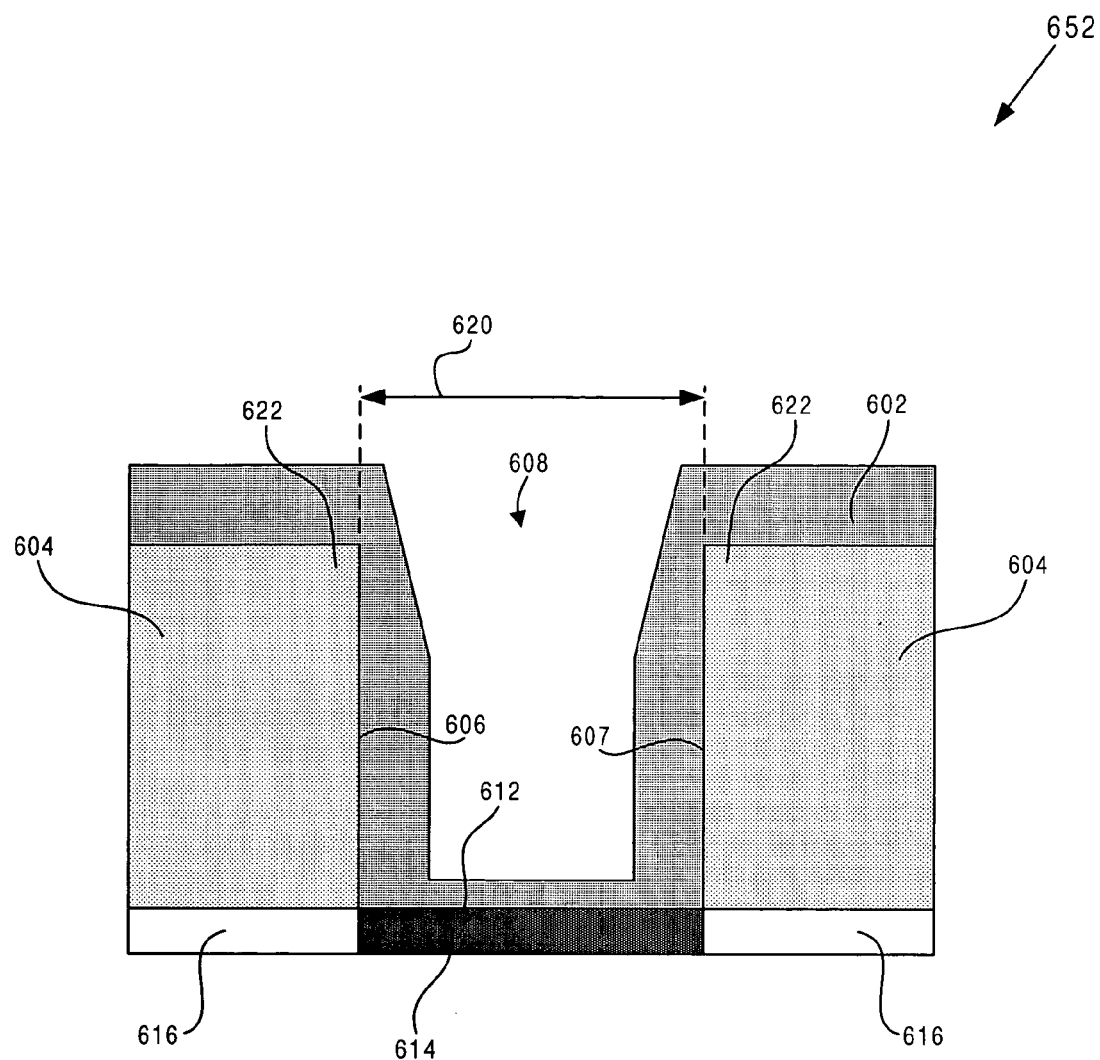
FIG. 6B illustrates a cross-sectional view of a portion of a wafer processed according to an embodiment of the invention, corresponding to certain steps of the flowchart in FIG. 5.

Continuing with step 552 in FIG. 5 and structure 652 in FIG. 6B, at step 552 of flowchart 500, a simultaneous sputter etch/deposition process is performed to remove native oxide layer 610 situated over silicide layer 614 at bottom 612 of contact hole 608. In the simultaneous sputter etch/deposition process, Ar can be utilized for sputter etching and Ti/TiN can be deposited on sidewalls 606 and bottom 612 of contact hole 608, utilizing, for example, a sputter deposition technique. The simultaneous sputter etch/deposition process can utilize an appropriate sputter etch/deposition ratio such that native oxide layer 610 is etched (i.e. removed). By way of example, the ratio of Ar and Ti/TiN molecules can be selected to achieve a sputter etch/deposition ratio of between 1.0 and 2.0. Thus, by utilizing a sputter etch/deposition ratio greater than 1.0, the present embodiment achieves removal of native oxide layer 610 while protecting top corner regions 622 of dielectric layer 604 by depositing Ti/TiN back onto sidewalls 606 and 607 of contact hole 608. Contact hole 608 can be filled with a metal such as tungsten in a subsequent step to complete contact formation. Referring to FIG. 6B, the result of step 552 of flowchart 500 is illustrated by structure 652.

Thus, in the embodiment of the present invention in FIG. 5, by utilizing a simultaneous sputter etch/deposition process, the present invention achieves removal of a native oxide layer at the bottom of a contact hole situated over a silicide layer while preventing an undesirable increase in contact hole width during contact formation.

Thus, as discussed above, in embodiments of the invention in FIGS. 1, 3, and 5, by appropriately selecting the sequence and techniques for sputter etch and barrier layer deposition processes, the present invention achieves removal of a native oxide layer at the bottom of a contact hole while preventing an undesirable increase in contact hole width during contact formation. In contrast, a conventional contact formation process, which utilizes an Ar sputter etch to remove a native oxide layer prior to barrier layer deposition, results in an undesirable increase in contact hole width.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, method for preventing an increase in contact hole width during contact formation has been described.

The invention claimed is:

1. A method for forming a contact over a silicide layer situated in a semiconductor die, said method comprising steps of:
   depositing a barrier layer on sidewalls of a contact hole and on a native oxide layer situated at a bottom of said contact hole, said sidewalls being defined by said contact hole in a dielectric layer, said native oxide layer being situated over said silicide layer;
   removing said native oxide layer situated over said silicide layer at said bottom of said contact hole by utilizing a sputter etch/deposition process.

2. The method of claim 1 wherein said step of removing said native oxide layer situated over said silicide layer at said bottom of said contact hole comprises simultaneously sputter etching said barrier layer and said native oxide layer and depositing titanium/titanium nitride on said barrier layer.

3. The method of claim 1 wherein said sputter etch/deposition process has a sputter etch/deposition ratio greater than 1.0.

4. The method of claim 1 wherein said dielectric layer comprises top corner regions situated adjacent to said contact hole, wherein said sputter etch/deposition process does not etch said top corner regions of said dielectric layer.

5. The method of claim 1 wherein said contact hole has an electrical contact width, wherein said electrical contact width is not increased by said sputter etch/deposition process.

6. The method of claim 1 wherein said sputter etch/deposition process comprises an argon sputter etch.

7. The method of claim 1 wherein said dielectric layer comprises PECVD oxide.

8. A method for forming a contact over a silicide layer situated in a semiconductor die, said method comprising steps of:
   depositing a barrier layer on sidewalls of a contact hole and on a native oxide layer situated at a bottom of said contact hole, said sidewalls being defined by said contact hole in a dielectric layer;
   removing a portion of said barrier layer and said native oxide layer situated at said bottom of said contact hole to expose said suicide layer, wherein said step of depositing said barrier layer on said sidewalls of said contact hole is optimized such that said barrier layer has a greater thickness at a top of said contact hole than a thickness at said bottom of said contact hole.

* * * * *